United States Patent
Cunningham (10) Patent No.: US 6,882,264 B2
(45) Date of Patent: Apr. 19, 2005

(54) ELECTROTHERMAL SELF-LATCHING MEMS SWITCH AND METHOD

(75) Inventor: Shawn Jay Cunningham, Colorado Springs, CO (US)

(73) Assignee: Wispry, Inc., Irvine, CA (US)

( * ) Notice: Subject to any disclaimer, the term of this patent is extended or adjusted under 35 U.S.C. 154(b) by 0 days.

(21) Appl. No.: 10/290,807

(22) Filed: Nov. 8, 2002

(65) Prior Publication Data

US 2003/0117257 A1 Jun. 26, 2003

Related U.S. Application Data (60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338,055, filed on Nov. 9, 2001, provisional application No. 60/338,069, filed on Nov. 9, 2001, and provisional application No. 60/338,072, filed on Nov. 9, 2001.

(51) Int. Cl.[7] .......................... H01H 37/52; H02N 2/00
(52) U.S. Cl. .......................... 337/139; 337/12; 337/14; 337/36; 60/528; 60/529; 310/307
(58) Field of Search .......................... 337/12, 14, 36, 337/139, 140, 141, 339, 343, 393, 298; 60/527–529; 310/306–309

(56) References Cited

U.S. PATENT DOCUMENTS

| | | | |
|---|---|---|---|
| 4,423,401 A | * 12/1983 | Mueller | 337/107 |
| 5,619,177 A | * 4/1997 | Johnson et al. | 337/140 |
| 5,796,152 A | 8/1998 | Carr et al. | |
| 5,824,186 A | 10/1998 | Smith et al. | |
| 6,046,659 A | * 4/2000 | Loo et al. | 333/262 |
| 6,236,300 B1 | * 5/2001 | Minners | 337/139 |
| 6,316,278 B1 | 11/2001 | Jacobsen et al. | |
| 6,324,748 B1 | 12/2001 | Dhuler et al. | |
| 6,348,851 B1 | * 2/2002 | Wyser et al. | 337/411 |
| 6,367,251 B1 | * 4/2002 | Wood | 60/528 |
| 6,531,947 B1 | * 3/2003 | Weaver et al. | 337/139 |
| 2003/0048170 A1 | * 3/2003 | Bromley et al. | 337/333 |

\* cited by examiner

Primary Examiner—Anatoly Vortman
(74) Attorney, Agent, or Firm—Jenkins, Wilson & Taylor, P.A.

(57) ABSTRACT

Electrothermal Self-Latching MEMS Switch and Method. According to one embodiment, a microscale switch having a movable microcomponent is provided and includes a substrate having a stationary contact. The switch can also include a structural layer having a movable contact positioned for contacting the stationary contact when the structural layer moves toward the substrate. An electrothermal latch attached to the structural layer and having electrical communication with the movable contact to provide current flow between the electrothermal latch and the stationary contact when the movable contact contacts the stationary contact for maintaining the movable contact in contact with the stationary contact.

20 Claims, 7 Drawing Sheets

ELECTROTHERMAL SELF-LATCHING MEMS SWITCH AND METHOD

CROSS-REFERENCE TO RELATED APPLICATIONS

This nonprovisional application claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisional Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following U.S. Patent Applications, commonly assigned and simultaneously filed herewith, are all incorporated by reference herein in their entirety: U.S. Patent Applications entitled "MEMS Device Having a Trilayered Beam and Related Methods"; "Trilayered Beam MEMS Device and Related Methods"; "MEMS Device Having Contact and Standoff Bumps and Related Methods"; and "MEMS Device Having Electrothermal Actuation and Release and Method for Fabricating".

TECHNICAL FIELD

The present invention generally relates to micro-electromechanical systems (MEMS) devices and methods. More particularly, the present invention relates to the design and fabrication of movable MEMS microscale structures.

BACKGROUND ART

An electrostatic MEMS switch is a switch operated by an electrostatic charge and manufactured using MEMS techniques. A MEMS switch can control electrical, mechanical, or optical signal flow. MEMS switches have typical application to telecommunications, such as DSL switch matrices and cell phones, Automated Testing Equipment (ATE), and other systems that require low cost switches or low-cost, high-density arrays.

As can be appreciated by persons skilled in the art, many types of MEMS switches and related devices can be fabricated by either bulk or surface micromachining techniques. Bulk micromachining generally involves sculpting one or more sides of a substrate to form desired three-dimensional structures and devices in the same substrate material. The substrate is composed of a material that is readily available in bulk form, and thus ordinarily is silicon or glass. Wet and/or dry etching techniques are employed in association with etch masks and etch stops to form the microstructures. Etching is typically performed on the frontside and backside of the substrate. The etching technique can generally be either isotropic or anisotropic in nature. Isotropic etching is insensitive to the crystal orientation of the planes of the material being etched (e.g., the etching of silicon by using a nitric acid as the etchant). Anisotropic etchants, such as potassium hydroxide (KOH), tetramethyl ammonium hydroxide (TMAH), and ethylenediamine pyrochatechol (EDP), selectively attack different crystallographic orientations at different rates, and thus can be used to define relatively accurate sidewalls in the etch pits being created. Etch masks and etch stops are used to prevent predetermined regions of the substrate from being etched.

On the other hand, surface micromachining generally involves forming three-dimensional structures by depositing a number of different thin films on the top of a silicon wafer, but without sculpting the wafer itself. The films usually serve as either structural or sacrificial layers. Structural layers are frequently composed of polysilicon, silicon nitride, silicon dioxide, silicon carbide, or aluminum. Sacrificial layers are frequently composed of polysilicon, photoresist material, polyimide, metals or various kinds of oxides, such as PSG (phosphosilicate glass) and LTO (low-temperature oxide). Successive deposition, etching, and patterning procedures are carried out to arrive at the desired microstructure. In a typical surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure is ordinarily anchored to the silicon substrate, and can be designed to be movable in response to an input from an appropriate actuating mechanism.

Many current MEMS switch designs employ a cantilievered beam (or plate), or multiply-supported beam geometry for the switching structure. In the case of cantilevered beams, these MEMS switches include a movable, bimaterial beam comprising a structural layer of dielectric material and a layer of metal. Typically, the dielectric material is fixed at one end with respect to the substrate and provides structural support for the beam. The layer of metal is attached on the underside of the dielectric material and forms a movable electrode and a movable contact. The layer of metal can form part of the anchor. The movable beam is actuated in a direction toward the substrate by the application of a voltage difference across the electrode and another electrode attached to the surface of the substrate. The application of the voltage difference to the two electrodes creates an electrostatic field, which pulls the beam towards the substrate. The beam and substrate each have a contact which is separated by an air gap when no voltage is applied, wherein the switch is in the "open" position. When the voltage difference is applied, the beam is pulled to the substrate and the contacts make an electrical connection, wherein the switch is in the "closed" position.

One of the problems that faces current MEMS switches having a bimaterial beam is curling or other forms of static displacement or deformation of the beam. The static deformation can be caused by a stress mismatch or a stress gradient within the films. At some equilibrium temperature, the mismatch effects could be balanced to achieve a flat bimaterial structure, but this does not fix the temperature dependent effects. The mismatch could be balanced through specific processes (i.e., deposition rates, pressures, method, etc.), through material selection, and through geometrical parameters such as thickness. This bimaterial structure of metal and dielectric introduces a large variation in function over temperature, because the metal will typically have a higher thermal expansion rate than the dielectric. Because of the different states of static stress in the two materials, the switch can be deformed with a high degree of variability. Switch failure can result from deformation of the beam. Switch failure results when electrical contact is not established between the movable and stationary contacts due to static deformation or because of the deformation introduced as a function of temperature. A second mode of failure is observed when the movable contact and the stationary contact are prematurely closed, resulting in a "short". Because of the deformation of the beam, the actuation voltage is increased or decreased depending on whether it is curved away from the substrate or towards the substrate, respectively. Because of this variability, the available voltage may not be adequate to achieve the desired contact force and, thus, contact resistance.

Typically, the beam of a MEMS switch is restored to an "open" position from a "closed" position by reducing the actuation voltage an amount sufficient for the resilient forces of the beam to deflect the beam back to the "open" position. The contacts of a MEMS switch frequently adhere to one another due metallurgical adhesion, cold welding, or hot welding forces. These forces are sometimes greater than the resilient forces of the beam, thus preventing the deflection of the beam to the "open" position. In such cases, switch failure results because the beam does not return to the "open" position. Therefore, it is desired to have a MEMS switch having a mechanism for generating a force to return the beam to an "open" position.

DISCLOSURE OF THE INVENTION

According to one embodiment, a self-latching microscale switch having a movable microcomponent is provided. The switch can include a substrate having a stationary contact. The switch can also include a structural layer having a movable contact positioned for contacting the stationary contact when the structural layer moves toward the substrate. An electrothermal latch attached to the structural layer and having electrical communication with the movable contact to provide current flow between the electrothermal latch and the stationary contact when the movable contact contacts the stationary contact for maintaining the movable contact in contact with the stationary contact.

According to a second embodiment, a method for maintaining a microscale switch in a closed position is provided. The method can include providing a stationary contact formed on a substrate, and the method can also include providing a movable microcomponent suspended above the substrate. The microcomponent can include a structural layer having a movable contact positioned for contacting the stationary contact when the structural layer is moved towards the substrate. An electrothermal latch can be attached to the structural layer and have electrical communication with the movable contact. The method can also include moving the structural layer towards the substrate whereby the movable contact moves into contact with the stationary contact. The method can include providing current flow between the electrothermal latch and the stationary contact to maintain the movable contact in contact with the stationary contact.

According to a third embodiment, a method for fabricating a self-latching microscale switch is provided. The method can include depositing a first conductive layer on a substrate and forming a stationary contact by removing a portion of the first conductive layer. A sacrificial layer can be deposited on the stationary contact and the first conductive layer. A second conductive layer can be deposited on the sacrificial layer. A movable contact can be formed by removing a portion of the second conductive layer. The method can also include depositing a structural layer on the movable contact and the sacrificial layer. A via can be formed through the structural layer to the movable contact. The method can include depositing a third conductive layer on the structural layer and in the via. A portion of the third conductive layer can be removed to form an electrothermal latch, wherein the electrothermal latch electrically communicates with the movable contact through the via. A sufficient amount of the sacrificial layer can be removed so as to define a second gap between the stationary contact and the movable contact.

According to a fourth embodiment, a method for maintaining a microscale switch in a closed position is provided. The method can include moving a structural layer having a movable contact towards a substrate having a stationary contact whereby the movable contact moves into contact with the stationary contact. The method can also include applying a current through the movable contact, the stationary contact, and an electrothermal latch attached to the structural layer and in electrical communication with the movable contact, whereby the electrothermal latch maintains the movable contact in contact with the stationary contact.

Accordingly, it is an object to provide a novel electrothermal self-latching MEMS switch and method.

An object having been stated hereinabove, and which is achieved in whole or in part by the electrothermal self-latching MEMS switch and method described herein, other objects will become evident as the description proceeds when taken in connection with the accompanying drawings as best described hereinbelow.

BRIEF DESCRIPTION OF THE DRAWINGS

Exemplary embodiments of the invention will now be explained with reference to the accompanying drawings, of which.

DETAILED DESCRIPTION OF THE INVENTION

For purposes of the description herein, it is understood that when a component such as a layer or substrate is referred to as being "disposed on", "attached to" or "formed on" another component, that component can be directly on the other component or, alternatively, intervening components (for example, one or more buffer or transition layers, interlayers, electrodes or contacts) can also be present. Furthermore, it is understood that the terms "disposed on", "attached to" and "formed on" are used interchangeably to describe how a given component can be positioned or situated in relation to another component. Therefore, it will be understood that the terms "disposed on", "attached to" and "formed on" do not introduce any limitations relating to particular methods of material transport, deposition, or fabrication.

Contacts, interconnects, conductive vias, electrothermal components and electrodes of various metals can be formed by sputtering, CVD, or evaporation. If gold, nickel or PERMALLOY™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium-tungsten (TiW). Some metal combinations can require a diffusion barrier to prevent a chromium adhesion layer from diffusing through gold. Examples of diffusion barriers between gold and chromium include platinum or nickel.

Conventional lithographic techniques can be employed in accordance with fabrication, such as micromachining, of the invention described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethyl) ammonium hydroxide ($(CH_3)_4NOH$, also known commercially as TMAH), and ethylenediamine mixed with pyrochatechol in water (EDP) can be used for anisotropic wet etching to fabricate V-shaped or tapered grooves, trenches or cavities. Silicon nitride can typically be used as the masking material against etching by KOH, and thus can used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the other alkaline etchants and EDP. Silicon oxide and silicon nitride can be used as masks against TMAH and EDP. The preferred metal used to form contacts and interconnects in accordance with the invention is gold and its alloys.

Commonly known wet etchants can be used to etch materials such as copper, gold, silicon dioxide, and secondary materials such as the adhesion and barrier materials. For example, gold can be etched with an aqueous solution of $KI_3$ in a temperature range of 20 to 50° C. As another example, chromium (a common adhesive layer) can be wet etched at 25° C. in a solution of ceric ammonium nitrate, nitric acid, and $H_2O$. Furthermore, for example, copper can be etched 25° C. in a dilute solution of nitric acid. A common method of etching silicon dioxide is with various aqueous solutions of HF or solutions of HF that are buffered with ammonium fluoride.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage can be applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures. For example of a dry etching process, silicon dioxide can be etched in chemistries involving $CF_4+O_2$, $CHF_3$, $C_2F_6$, or $C_3F_8$. As another example, gold can be dry etched with $C_2Cl_2F_4$ or $C_4Cl_2F_4+O_2$.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semi-conducting materials.

Examples will now be described with reference to the accompanying drawings.

Figure 1:
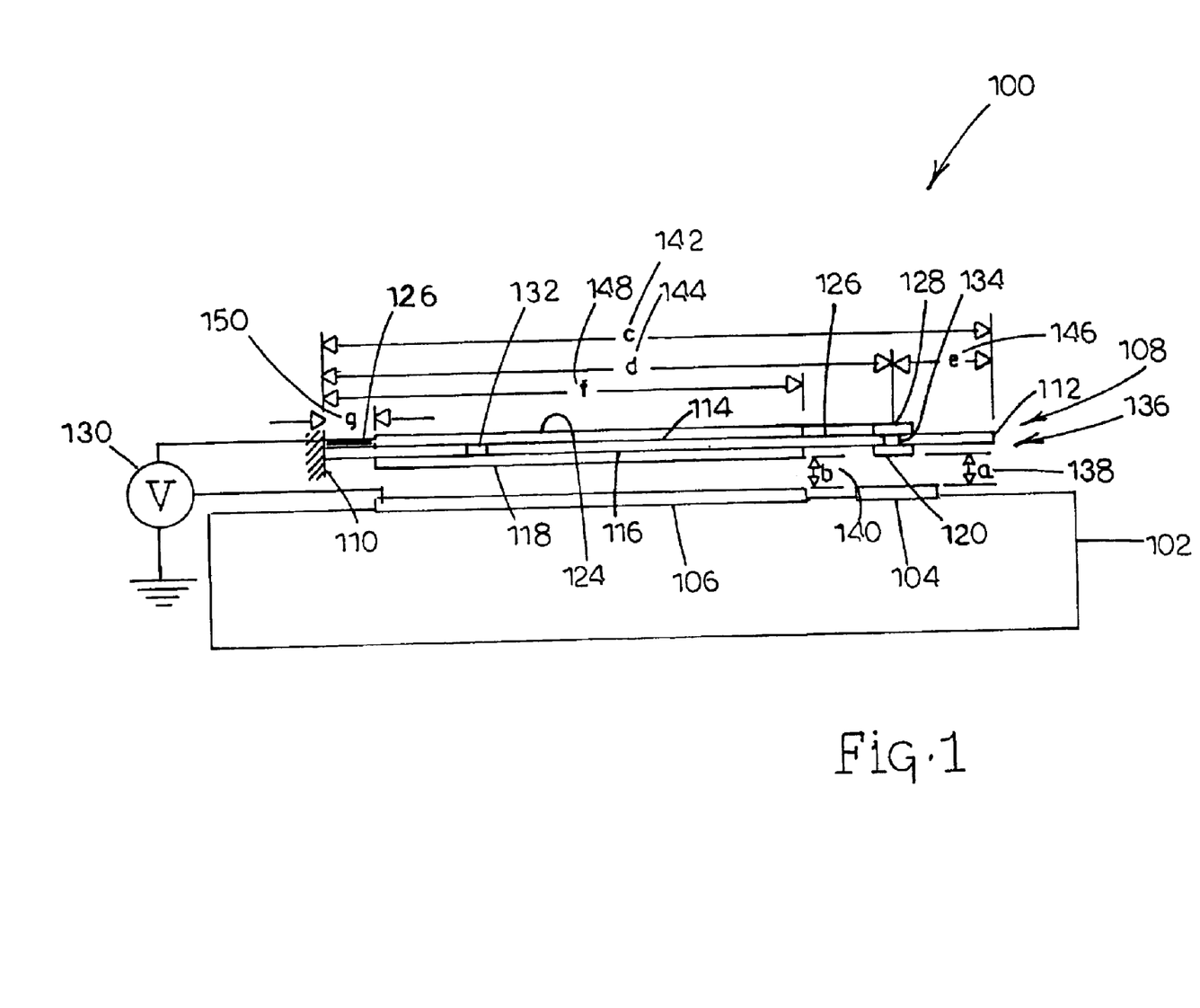
FIG. 1 illustrates a cross-sectional side view of a MEMS switch having electrothermal self-latching in an "open" position.

Referring to FIGS. 1–5, different views of a MEMS switch, generally designated 100, having electrothermal self-latching are illustrated. Referring specifically to FIG. 1, a cross-sectional side view of MEMS switch, generally designated 100, is illustrated in an "open" position. MEMS switch 100 includes a substrate 102. Non-limiting examples of materials which substrate 102 can comprise include silicon (in single-crystal, polycrystalline, or amorphous forms), silicon oxinitride, glass, quartz, sapphire, zinc oxide, alumina, silica, or one of the various Group III–V compounds in either binary, ternary or quaternary forms (e.g., GaAs, InP, GaN, AlN, AlGaN, InGaAs, and so on). If the composition of substrate 102 is chosen to be a conductive or semi-conductive material, a non-conductive, dielectric layer can be deposited on the top surface of substrate 102, or at least on portions of the top surface where electrical contacts or conductive regions are desired.

Substrate 102 includes a stationary contact 104 and a stationary electrode 106 formed on a surface thereof. Stationary contact 104 and stationary electrode 106 can comprise a conductive material such as a metal. Further, stationary contact 104 and stationary electrode 106 can comprise different conductive materials such as gold-nickel alloy ($AuNi_5$) and aluminum or other suitable conductive materials known to those of skill in the art. The conductivity of stationary electrode 106 can be much lower than the conductivity of stationary contact 104. Preferably, stationary contact 104 can comprise a very high conductive material such as copper. Preferably, stationary contact 104 has a width range of 5 to 25 microns. Stationary electrode 106 can have a wide range of dimensions depending on the required actuation voltages, contact resistance, and other functional parameters.

MEMS switch 100 further comprises a movable, trilayered beam generally designated 108, suspended over stationary contact 104 and stationary electrode 106. Beam 108 is fixedly attached at one end to a mount 110, which can be fixedly attached to substrate 102. Beam 108 extends substantially parallel to the top surface of substrate 102 when MEMS switch 100 is in an "open" position. Beam 108 generally comprises a dielectric structural layer 112 sandwiched between two electrically conductive layers described in more detail below. Structural layer 112 can comprise a bendable, resilient material, preferably silicon oxide ($SiO_2$, as it is sputtered, electroplated, spun-on, or otherwise deposited), to deflect towards substrate 102 for operating in a "closed" position. Structural layer 112 provides electrical isolation and desirable mechanical properties including resiliency properties. Alternatively, structural layer 112 can comprise silicon nitride ($Si_xN_y$), silicon oxynitride, alumina or aluminum oxide ($Al_xO_y$), polymers, CVD diamond, their alloys, or any other suitable bendable, resilient materials known to those of skill in the art.

In this embodiment, beam 108 further includes a top layer and a bottom layer attached to a top side 114 and an underside 116, respectively, of structural layer 112. The bottom layer comprises a movable electrode 118 and a movable contact 120. The top layer comprises an electrode interconnect 124, an electrothermal latch 126, and a contact interconnect 128. Electrode interconnect 124 is shown with broken lines in this view due to its position behind electrothermal latch 126. As shown, movable contact 120 and contact interconnect 128 are positioned further from mount 110 than electrode interconnect 124 and contact interconnect 128. Electrothermal latch 126 extends substantially the length of beam 108 for connection to contact interconnect 128.

MEMS switch 100 further includes a voltage source 130 for applying a voltage difference across electrodes 106 and 118 for electrostatic actuation of beam 108. Voltage source 130 can be directly connected to stationary electrode 106 and indirectly connected to movable electrode 118 through electrode interconnect 124 and a first interconnect via 132. First interconnect via 132 extends through structural layer 112 for providing an electrical connection between movable electrode 118 and electrode interconnect 124. Therefore, upon application of a voltage difference by voltage source 130, electrostatic coupling is established between electrodes 106 and 118 across an air gap, referenced hereinbelow. The electrostatic field creates an attractive force between electrodes 106 and 118 for pulling beam 108 towards substrate 102. In the alternative, the gap between electrodes 118 and 106 can be any suitable isolating fluid as known to those of skill in the art, such as $SF_6$, which has a high breakdown voltage and provides a quenching effect during an arcing event.

Preferably, movable electrode 118 and electrode interconnect 124 are fabricated of the same material and dimensioned the same. Additionally, movable contact 120 and contact interconnect 128 can be fabricated of the same material and dimensioned the same. First, it provides mechanical balance on both sides of structural layer 112. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 112. This means that any functional variation exhibited by MEMS switch 100 depends primarily on the process variation, which can be minimized by the appropriate optimization of the design in the process. Secondly, because movable contact 120 and contact interconnect 128 are fabricated of the same material and dimensioned the same, the current carrying capacity of contacts 120 and 128 is aided. It is preferable that beam 108 has the same type of metal, deposited by the same process, patterned in the same geometry, and deposited to the same thickness, but the use of different materials could be accommodated with the appropriate design and characterization. To address the issues of contact adhesion, cold welding, or hot welding, contacts 104 and 120 could be different materials or different alloys of the same materials. The material selection minimizes contact resistance and failures such as stiction.

Electrodes 106 and 118, contacts 104 and 120, electrothermal latch 126, and interconnects 124 and 128 can comprise similar materials, such as gold, whereby the manufacturing process is simplified by the minimization of the number of different materials required for fabrication. Additionally, electrodes 106 and 118, contacts 104 and 120, electrothermal latch 126, and interconnects 124 and 128 can comprise conductors (platinum, aluminum, palladium, copper, tungsten, nickel, and other materials known to those of skill in the art), conductive oxides (indium tin oxide), and low resistivity semiconductors (silicon, polysilicon, and other materials known to those of skill in the art). These components can include adhesion layers (Cr, Ti, TiW, etc.) disposed between the component and structural material 112. These components can comprise a conductive material and an adhesion layer that includes diffusion barriers for preventing diffusion of the adhesion layer through the electrode material, the conductor material through the adhesion layer or into the structural material. These components can also comprise different materials for breakdown or arcing considerations, for "stiction" considerations during wet chemical processing, or because of fabrications process compatibility issues. Contacts 104 and 120 can comprise a material having good conductive properties and other desirable properties of suitable contacts known to those of skill in the art, such as low hardness and low wear. Preferably, contacts 104 and 120 comprise a material having low resistivity, low hardness, low oxidation, low wear, and other desirable properties of suitable contacts known to those of skill in the art. Preferably, electrothermal latch 126 comprises a material having high resistivity, high softening/melting point, and high current capacity. The preferred properties contribute to high localized heating for development of larger deflections and forces. The high softening/melting point and high current capacity increase the reliability of the device during electrothermal operation. In one embodiment, electrode interconnect 124, electrothermal latch 126, and contact interconnect 128 comprise the same material. Alternatively, electrode interconnect 124, electrothermal latch 126, and contact interconnect 128 can comprise different materials.

MEMS switch 100 provides a switching function that establishes an electrical connection between stationary contact 104 and a fixed contact (not shown) located at mount 110 when beam 108 is moved to a "closed" position. Conversely, when beam 108 is not in a "closed" position, there is no electrical connection between stationary contact 104 and the fixed contact. Movable contact 120 can be suspended over stationary contact 104 in a position such that it will contact stationary contact 104 when beam 108 is deflected to the "closed" position. Movable contact 120 and contact interconnect 128 are electrically connected through structural layer 112 by a second interconnect via 134 (shown with broken lines due to its position within structural layer 112). As stated above, contact interconnect 128 is connected to electrothermal latch 126, which is connected to the fixed contact. Thus, when switch 100 operates in the "closed" position, the fixed contact is provided electrical communication with stationary contact 104 through electrothermal latch 126, contact interconnect 128, second interconnect via 134, and movable contact 120. When switch 100 is not operating in the "closed" position, contacts 104 and 120 are separated by an air gap such that there is no electrical communication between stationary contact 104 and the fixed contact.

Movable contact 120 is dimensioned smaller than stationary contact 104 to facilitate contact when process and alignment variability are taken into consideration. Stationary contact 104 needs to be sized appropriately so that movable contact 120 always makes contact with stationary contact 104 when beam 108 is moved to the "closed" position. A second consideration that determines the size of movable contact 120 and stationary contact 104 is the parasitic response of switch 100. The parasitic actuation response is generated by electric fields produced by potential differences between contacts 104 and 120 that produce electric fields and a force on structural layer 112 which moves movable contact 120. The dimensions of contacts 104 and 120 are related to the dimensions of contact 104 and 120 for achieving a specific ratio of the parasitic actuation to the actuation voltage.

Movable contact 120 and contact interconnect 128 are attached to opposing sides of structural layer 112. Contact interconnect 128 is dimensioned substantially the same as movable contact 120. Contact interconnect 128 and movable contact 120 are aligned with respect to each other and have substantially the same dimensions. Alternatively, contact interconnect 128 can have different dimensions and extent than movable contact 120. Contact interconnect 128 and movable contact 120 are intended to share a geometrical and thermo-mechanical equivalence. This equivalence provides a beam, which can achieve a manufacturable flatness that is maintained over temperature and other environmental conditions, such as die attachment, package lid seal processes, or solder reflow process. In this embodiment, contact interconnect 128 comprises a conductive material, such as gold (Au), having the same coefficient of thermal expansion, elastic modulus, residual film stress, and other desirable electrical/mechanical properties known to those of skill in the art as movable contact 120.

Movable electrode 118 and electrode interconnect 124 are attached to opposing sides of structural layer 112. Preferably, electrode interconnect 124 has substantially the same dimensions as movable electrode 118 and is aligned with movable electrode 118 on the opposing side in order to achieve a manufacturable flatness that is maintained over temperature. Alternatively, electrode interconnect 124 can have different dimensions and extent than movable electrode 118. In this embodiment, electrode interconnect 124 comprises a conductive material having the same coefficient of thermal expansion, elastic modulus, residual film stress, and other electrical/mechanical properties as movable electrode 118. Alternatively, electrode interconnect 124 can have different dimensions and extent than movable electrode 118. Electrode interconnect 124 and movable electrode 118 are intended to share a geometrical and thermo-mechanical equivalence. This equivalence provides a beam that can achieve manufacturable flatness that is maintained over temperature and other environmental conditions, such as die attachment, package lid seal processes, or solder reflow process.

As stated above, electrode interconnect 124 and movable electrode 118 are electrically connected through structural layer 112 by first interconnect via 132 (shown with broken lines due to its position within structural layer 112). First interconnect via 132 comprises a conductive material formed through structural layer 112 for electrically connecting movable electrode 118 and electrode interconnect 124. In this embodiment, first interconnect via 132 comprises the same conductive material as movable electrode 118 and electrode interconnect 124. Alternatively, first interconnect via 132 can comprise any suitable conductive material known to those of skill in the art, with properties such as high conductivity, high current capacity, low tendency for electromigration.

MEMS switch 100 includes an electrothermal self-latching function for maintaining beam 108 in the "closed" position without application of a voltage difference across electrodes 106 and 118. The electrothermal self-latching function operates when contacts 104 and 120 touch and current flows through movable contact 120, first interconnect via 130, contact interconnect 128, and electrothermal latch 126. Electrothermal latch 126 includes resistance path transitions (shown in FIG. 2) for providing an abrupt change in the density of current flow through electrothermal latch 126. Alternatively, the resistance path transition can be realized by a change in thickness rather than a change in width. Alternatively, electrothermal latch 126 can comprise material transitions rather than area transitions to accomplish the resistance path transitions. The material transitions are realized by patterning different materials on either side of the resistance path transition. For example, nickel (Ni) and gold (Au) can be patterned on a first and second side of the resistance path transition. Two different suitable materials having differing thermal and mechanical properties as known to those of skill in the art can be used to form the resistance path transition. The magnitude of the localized heating is determined by the difference in the geometric or material properties. The magnitude of the current density introduces a local temperature gradient on top of the structural layer 112 for elongating the top portion of structural layer 112, thereby increasing the deflection force of beam 108 for pressing together contacts 104 and 120. Beam 108 is "unlatched" when current flow through electrothermal latch 126 is reduced sufficiently such that the resilient force of structural layer 112 overcomes the electrothermal force for restoring beam to the "open" position. Once the contact between contacts 104 and 120 is broken such that beam 108 is not in the "closed" position, beam 108 will deflect to the "open" position.

The self-latching function of MEMS switch 100 is advantageous because it provides a force sufficient to maintain beam 108 in the "closed" position without application of a voltage difference by voltage source 130. Power requirements are reduced because the application of voltage is not required. Additionally, the self-latching function is advantageous because it can reduce the likelihood of welding between contacts 104 and 120. The likelihood of welding is reduced because the contact resistance between contacts 104 and 120 improves due to electrothermal forces. The electrothermal force deflecting structural layer 112 to substrate 102 increases as current flow through electrothermal latch 126 increases, thus improving the contact established between contacts 104 and 120 and reducing the contact resistance between contacts 104 and 120. Because contact resistance decreases with increased contact force, the electrothermal force will provide a switch having lower contact resistance. The lower contact resistance will result in a reduced contact temperature which will reduce the likelihood of welding.

Figure 2:
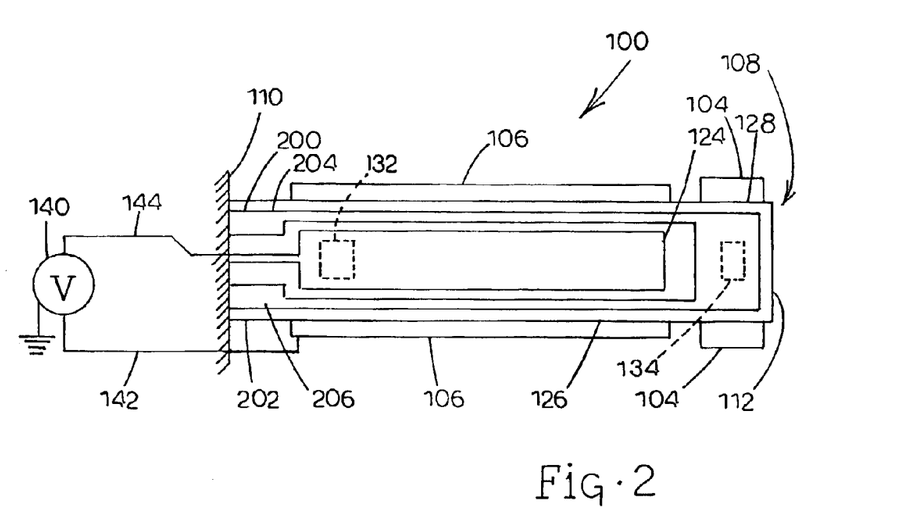
FIG. 2 illustrates a top plan view of an electrothermal self-latching MEMS switch.

Referring to FIG. 2, a top view of MEMS switch 100 is illustrated. As shown, electrothermal latch 126 includes two ends 200 and 202 positioned at mount 110 for connection to the fixed contact (not shown) located at mount 110. In this embodiment, electrothermal latch 126 extends from ends 200 and 202 along two conductive paths for connection to contact interconnect 128. Alternatively, electrothermal latch 126 can be directly connected to second interconnect via 134. Electrothermal latch 126 further includes resistance path transitions 204 and 206 positioned near ends 200 and 202, respectively, where the current paths change from a low resistance path to a high resistance path for providing local heating and local generation of force to facilitate actuation of beam 108. The position of resistance path transitions 204 and 206 and the ratio of the transition can be optimized for maximal force without damaging the component due to electrical overstress. Resistive heating along the length of electrothermal latch 126 will also provide the elongation that aids the actuation of beam 108. Thermal isolation is provided between electrode interconnect 124 and electrothermal latch 126 by a gap, generally designated as air gap 136, between the components and structural layer 112 which serves as an insulator.

Figure 3:
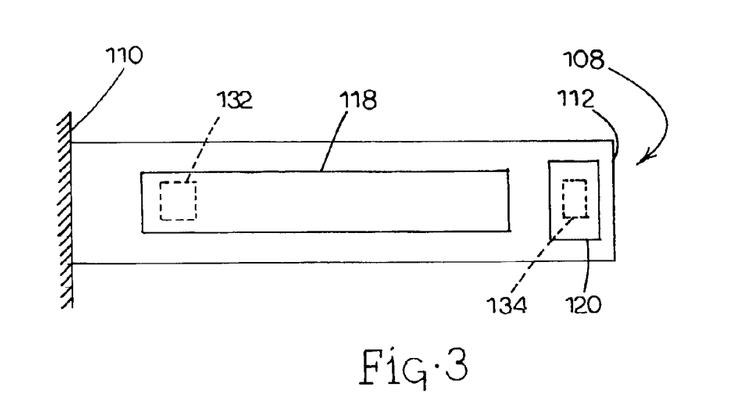
FIG. 3 illustrates a bottom plan view of a beam of an electrothermal self-latching MEMS switch.

As shown, electrode interconnect 124 and contact interconnect 128 can be generally rectangular in shape. The external corners of electrode interconnect 124 and contact interconnect 128 can be rounded to contain internal reentrant corners for reducing the intensification in the electric fields produced by the potential differences between conductors. In this embodiment, electrode interconnect 124 is dimensioned the same as movable electrode 118. Alternatively, electrode interconnect 124 can be any suitable non-rectangular shape that substantially matches the shape of movable electrode 118. The shape of contact interconnect 128 substantially matches the shape of movable contact 120. Interconnect vias 130 and 132 are rectangular and shown by broken lines due to their position behind contact interconnect 128 and electrode interconnect 124, respectively. Alternatively, interconnect vias 130 and 132 can be any geometry suitable for vias including circular, elliptical, or rectangular with rounded corners. Referring to FIG. 3, a bottom view of beam 108 of MEMS switch 100 is illustrated. As shown, movable contact 120 and movable electrode 130 are substantially rectangular.

Figure 4:
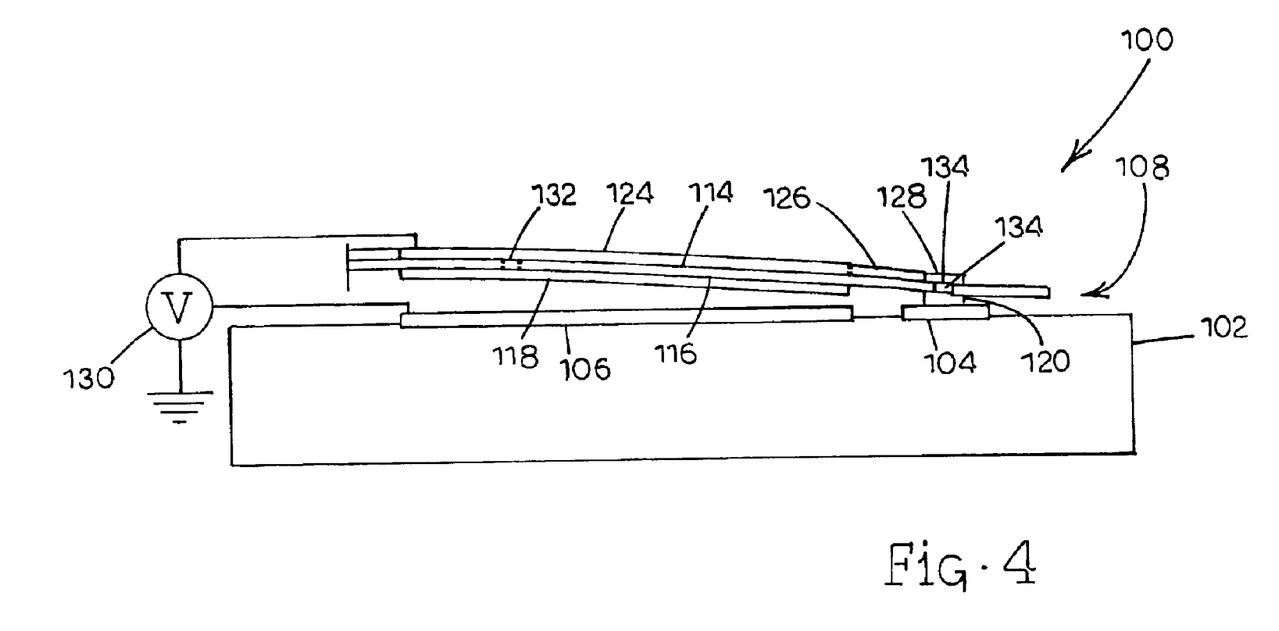
FIG. 4 illustrates a cross-sectional side view of an electrothermal self-latching MEMS switch in a "closed" position.

Upon the application of sufficient voltage by voltage source 130, beam 108 moves toward substrate 102 in a stable manner until movable electrode 118 is close enough to stationary electrode 106 for "pull-in" voltage, or "snap-in" voltage, to occur. After "pull-in" voltage occurs, beam 108 is pulled in an unstable manner towards substrate 102 until movable contact 120 touches stationary contact 104, thus establishing an electrical connection. Referring to FIG. 4, a cross-sectional side view of MEMS switch 100 is illustrated in a "closed" position wherein an electrical connection has been established. As shown in the "closed" position, movable contact 120 is touching stationary contact 104. As described below, the components of MEMS switch 100 are dimensioned such that movable electrode 118 does not contact stationary electrode 106 in the "closed" position, thus preventing a short between components 106 and 118.

MEMS switch 100 can be maintained in a "closed" position by the electrothermal actuation of electrothermal latch 126. The application of a voltage difference across electrodes 106 and 118 is not required to maintain beam 108 in the "closed" position.

In the "open" position, movable contact 120 is separated from stationary contact 104 by a gap distance a 138 as shown in FIG. 1. Movable electrode 118 is separated from stationary electrode 106 by a gap distance b 140. In this embodiment, distance a 138 is less than distance b 140. If distance a 138 is less than distance b 140, the operation of MEMS switch 100 is more reliable because potential for shorting between stationary electrode 106 and movable electrode 118 is reduced. The length of beam 108 is indicated by a distance c 142. The center of movable contact 120 is a distance d 144 from mount 110 and a distance e 146 from the end of beam 108 that is distal mount 110. The edge of electrode interconnect 124 distal mount 110 is a distance f 148 from mount 110. The edge of electrode interconnect 124 near mount 110 is a distance g 150 from mount 110. In this embodiment, distance a 138 is nominally 1.5 microns; distance b 140 is preferably 2 microns; distance c 142 is preferably 155 microns; distance d 144 is preferably 135 microns; distance e 146 is preferably 20 microns; distance f 148 is preferably 105 microns; and distance g 150 is 10 microns. The distances a 138, b 140, c 142, d 144, e 146, f 148, and g 150 provide desirable functional performance, but other dimensions can be selected to optimize other functional characteristics, manufacturability, and reliability.

Figure 5:
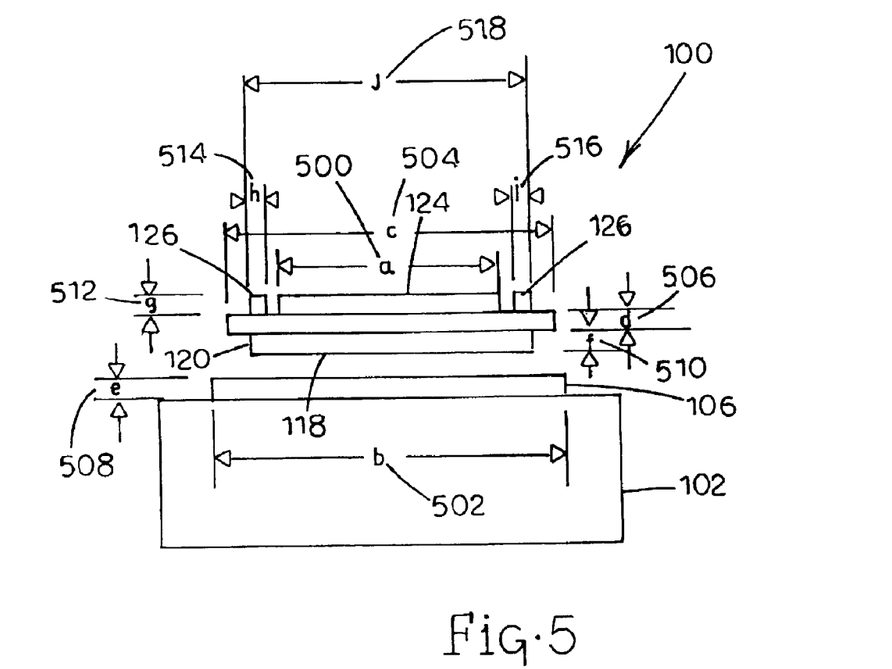
FIG. 5 illustrates a cross-sectional front elevation view of the stationary electrode, structural layer, movable electrode, electrode interconnect, and electrothermal latch of an electrothermal self-latching MEMS switch.

Referring to FIG. 5, a cross-sectional front view of stationary electrode 106, structural layer 112, movable electrode 118, electrothermal latch 126, and electrode interconnect 124 of MEMS switch 100 is illustrated. The width of electrode interconnect 124 is indicated by a distance a 500. The width of stationary electrode 106 is indicated by distance b 502. The width of structural layer 112 is indicated by distance c 504. The thickness of structural layer 112 is indicated by distance d 506. The thickness of stationary electrode 106 is indicated by distance e 508. The thickness of movable electrode 118 is indicated by distance f 510. The thickness of electrode interconnect 124 and electrothermal latch 126 is indicated by distance g 512. The width of the pathways of electrothermal latch 126 are indicated by distance h 514 and i 516. The width of movable electrode 118 is indicated by distance j 518. Stationary electrode 106 can be dimensioned greater than movable electrode 118 in order to facilitate shielding MEMS switch 100 from any parasitic voltages. In this embodiment, distance a 500 is preferably 75 microns; distance b 502 is preferably 102 microns; distance c 504 is preferably 105 microns; distance d 506 is preferably 2 microns; distance e 508 is preferably 0.5 microns; distance f 510 is preferably 0.5 microns; distance g 512 is preferably 0.5 microns; distances h 514 and i 516 are preferably 5 microns; and distance j 518 is preferably 95 microns. The distances a 500, b 502, c 504, d 506, e 508, f 510, g 512, h 514, i 516, and j 518 provide desirable functional performance, but other dimensions can be selected to optimize other functional characteristics, manufacturability, and reliability.

Figure 6A:
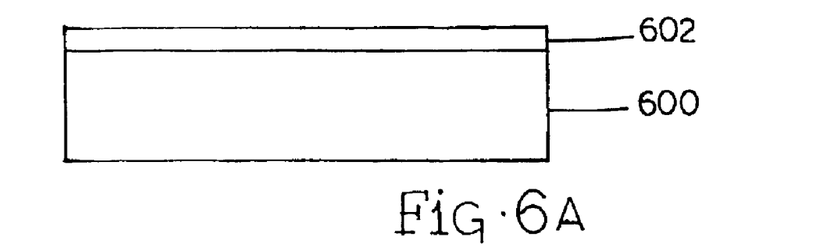
FIGS. 6A–K illustrate fabrication steps of another embodiment of a method for fabricating an electrothermal self-latching MEMS switch.

Referring to FIGS. 6A–6K, an example of one embodiment of a method for fabricating a MEMS switch having electrothermal self-latching according to a surface micromachining process of the present invention will now be described. Referring specifically to FIG. 6A, a substrate 600 is provided, which preferably comprises silicon. Because substrate 600 is a semi-conductive material, a first dielectric layer 602 is deposited on the top surface of substrate 600.

Alternatively, dielectric material can be deposited on portions of the top surface where electrical contacts or conductive regions are desired.

Figure 6B:
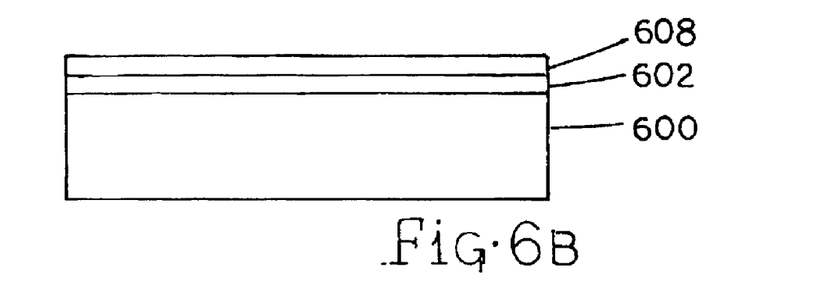
Figure 6C:
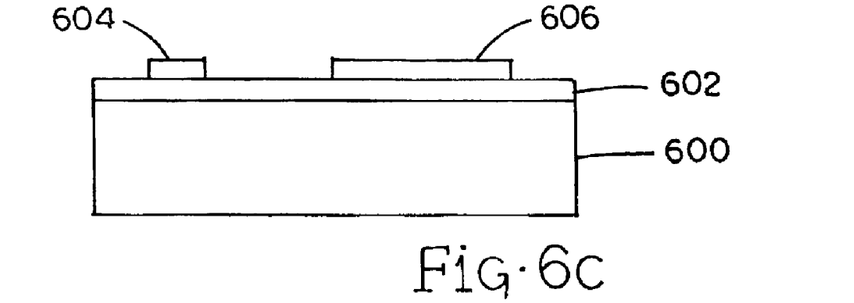

Referring to FIGS. 6B–6C, a process for producing a stationary contact 604 and a stationary electrode 606 is illustrated. Referring specifically to FIG. 6B, a first conductive layer 608 is deposited on first dielectric layer 602. First conductive layer 608 is patterned as described above. Referring to FIG. 6C, stationary contact 604 and stationary electrode 606 are formed simultaneously in first conductive layer 608. Alternatively, first stationary contact 604 and stationary electrode 606 can be formed in separate processes.

Figure 6D:
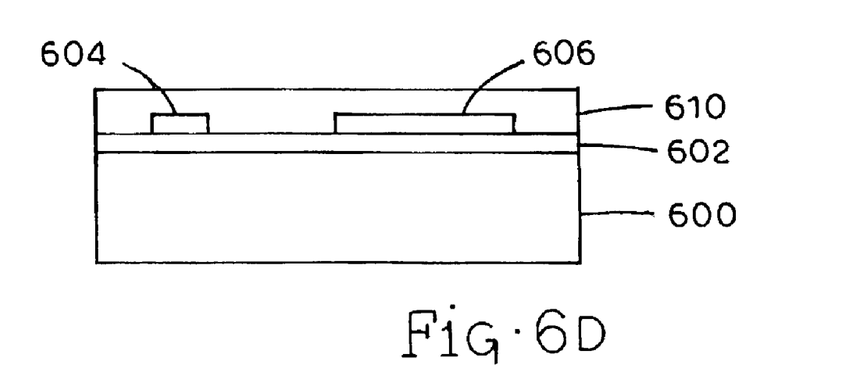

Referring to FIG. 6D, a sacrificial layer 610 is deposited to a uniform thickness such that its top surface is preferably planarized. Sacrificial layer 610 defines the gap between a beam structure, described in further detail below, and stationary contact 604 and stationary electrode 606. Sacrificial layer 610 can be a metal, dielectric or any other suitable material known to those of skill in the art such that the removal chemistry is compatible with the other electrical and structural materials.

Figure 6E:
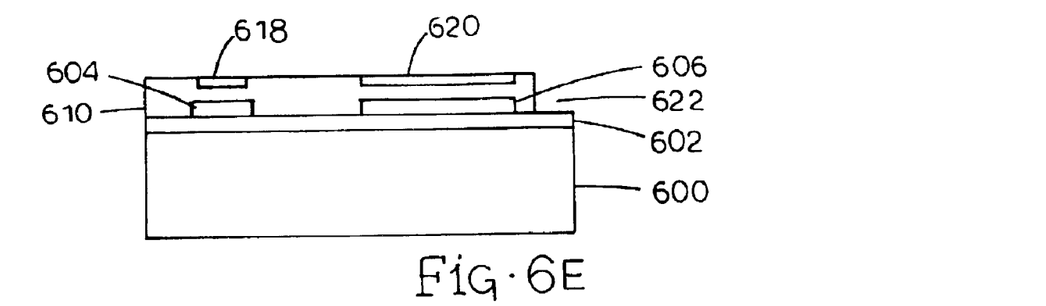
Figure 6F:
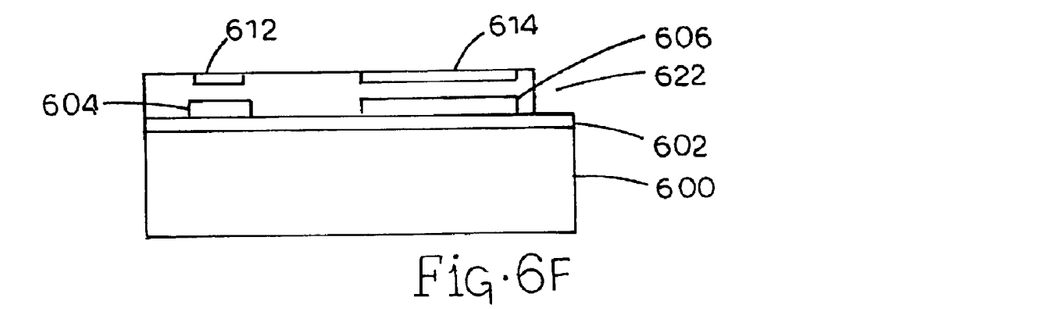

Referring to FIGS. 6E–6F, a process for producing a movable contact 612 and a movable electrode 614, as described above, is illustrated. Referring specifically to FIG. 6E, grooves 618 and 620 are etched in sacrificial layer 610 for forming movable contact 612 and movable electrode 614, respectively. Groove 622 is formed in sacrificial layer 610 for forming a structure to attach the beam to substrate 600 and suspend the beam above first stationary contact 604 and stationary electrode 606. Referring now to FIG. 6F, a conductive layer is deposited on sacrificial layer 610 until grooves 618 and 620 are filled. Next, the conductive layer is patterned as described above to form the movable contact 612 and movable electrode 614.

Figure 6G:
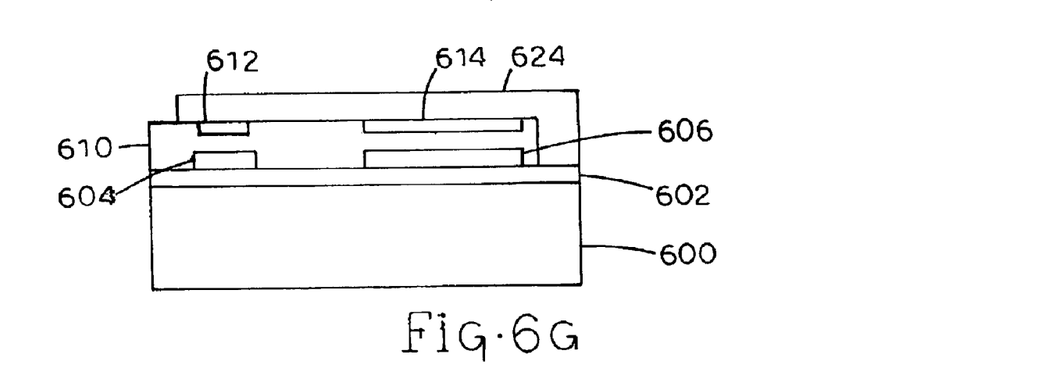

Referring FIG. 6G, a structural layer 624 is deposited on movable contact 612, movable electrode 614, sacrificial layer 610, and first dielectric layer 602. Structural layer 624 comprises oxide in this embodiment.

Figure 6H:
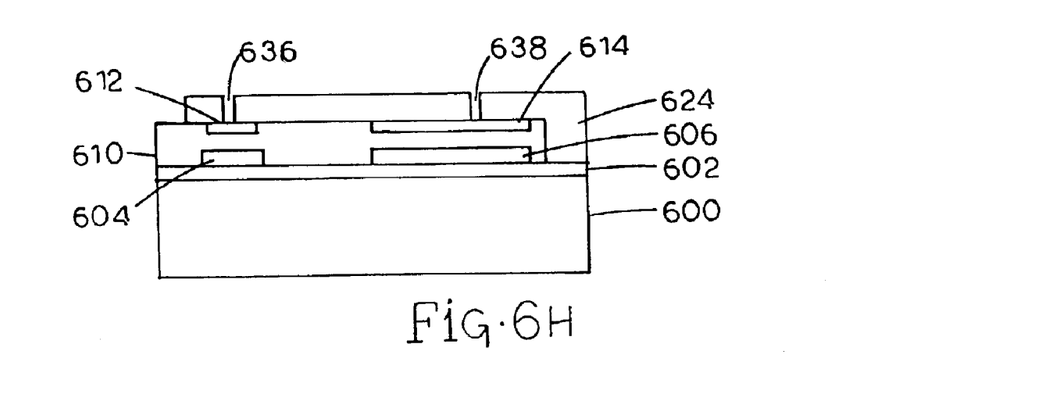
Figure 6I:
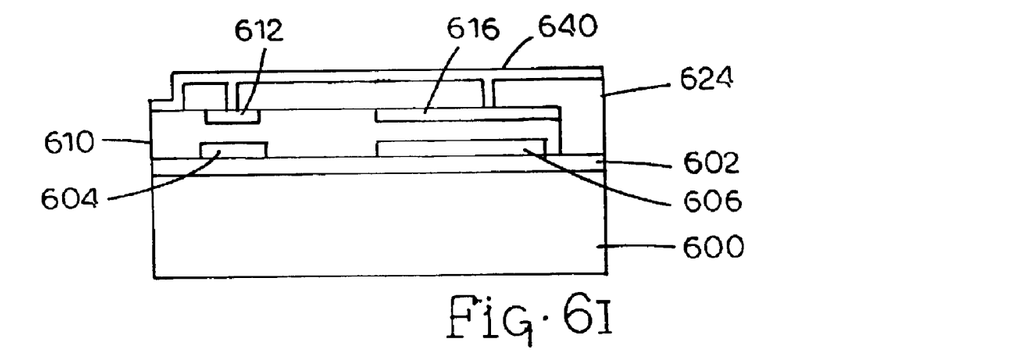
Figure 6J:
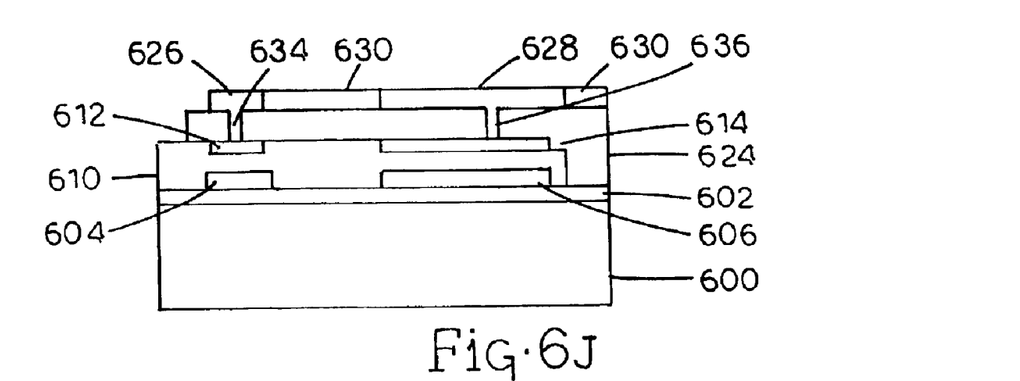

Referring to FIGS. 6H–6J, a process for simultaneously producing the following conductive microstructures: a contact interconnect 626, an electrode interconnect 628, an electrothermal latch 630, and interconnect vias 632 and 634. Referring specifically to FIG. 6H, recesses 636 and 648 are etched into structural layer 624 for forming interconnect vias 632 and 634, respectively. Recesses 636 and 638 are etched through structural layer 624 to movable contact 612 and movable electrode 614, respectively.

Referring now to FIG. 6I, a second conductive layer 640 is deposited on structural layer 624 and into recesses 636 and 638 as shown for forming an electrical connection from movable contact 612 and movable electrode 614 to the top surface of structural layer 624. Next, second conductive layer 640 is patterned for forming contact interconnect 626, electrode interconnect 628, and electrothermal latch 630 as shown in FIG. 6J. Interconnect vias 632 and 634 can be formed by another conductive layer that would precede the deposition of second conductive layer 640, described above.

Figure 6K:
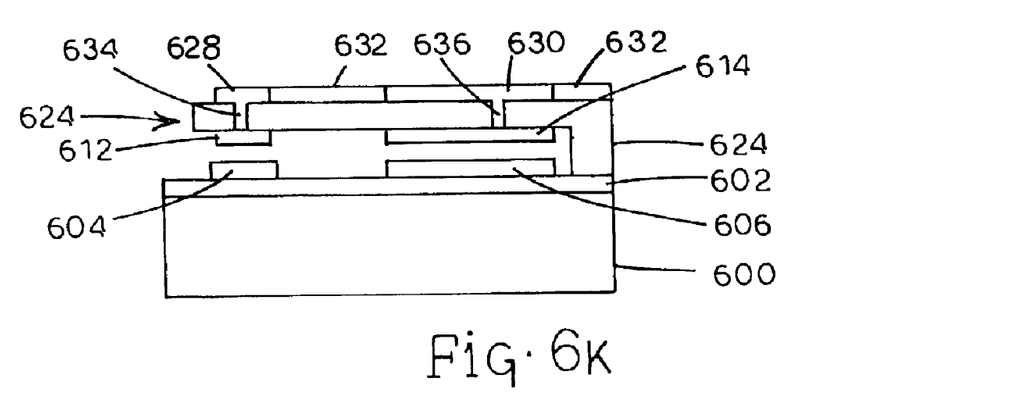

Referring to FIG. 6K, the final step in fabricating a MEMS switch having electrothermal self-latching is illustrated. In this step, sacrificial layer 610 is removed to form a trilayered beam, generally designated 642. Sacrificial layer 610 can be removed by any suitable method known to those of skill in the art.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for fabricating a self-latching microscale switch, the method comprising:
   (a) depositing a first conductive layer on a substrate;
   (b) forming a stationary contact by removing a portion of the first conductive layer;
   (c) depositing a sacrificial layer on the stationary contact and the first conductive layer;
   (d) depositing a second conductive layer on the sacrificial layer;
   (e) forming a movable contact by removing a portion of the second conductive layer;
   (f) depositing a structural layer on the movable contact and the sacrificial layer;
   (g) forming a via through the structural layer to the movable contact;
   (h) depositing a third conductive layer on the structural layer and in the via;
   (i) removing a portion of the third conductive layer to form an electrothermal latch, wherein the electrothermal latch electrically communicates with the movable contact through the via; and
   (j) removing a sufficient amount of the sacrificial layer so as to define a first gap between the stationary contact and the movable contact.

2. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the substrate further includes a stationary electrode and the structural layer further includes a movable electrode for moving the structural layer toward the substrate when a voltage difference is applied across the movable electrode and the stationary electrode.

3. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact;
   (d) wherein the substrate further includes a stationary electrode and the structural layer further includes a movable electrode for moving the structural layer toward the substrate when a voltage difference is applied across the movable electrode and the stationary electrode; and (e) wherein the movable electrode comprises a metal material.

4. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact;

(d) wherein the substrate further includes a stationary electrode and the structural layer further includes a movable electrode for moving the structural layer toward the substrate when a voltage difference is applied across the movable electrode and the stationary electrode; and (e) wherein the movable electrode comprises a semiconductive material.

5. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact;

(d) wherein the substrate further includes a stationary electrode and the structural layer further includes a movable electrode for moving the structural layer toward the substrate when a voltage difference is applied across the movable electrode and the stationary electrode; and (e) wherein the movable electrode substantially covers an underside of the structural layer.

6. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact;

(d) wherein the substrate further includes a stationary electrode and the structural layer further includes a movable electrode for moving the structural layer toward the substrate when a voltage difference is applied across the movable electrode and the stationary electrode; and (e) an electrode interconnect attached to a top surface of the structural layer opposite from the movable electrode and having electrical communication with the movable electrode.

7. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact;

(d) wherein the substrate further includes a stationary electrode and the structural layer further includes a movable electrode for moving the structural layer toward the substrate when a voltage difference is applied across the movable electrode and the stationary electrode;

(e) an electrode interconnect attached to a surface of the structural layer opposite from the movable electrode and having electrical communication with the moveable electrode; and (f) wherein the movable electrode and electrode interconnect have substantially equal respective coefficients of thermal expansion.

8. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and (d) wherein the electrothermal latch includes first and second terminal ends for communication with a fixed contact for providing electrical communication between the fixed contact and the stationary contact when the movable contact touches the stationary contact.

9. A self-latching microscale switch having a movable microcomponent, the switch comprising:

(a) a substrate including a stationary contact;

(b) a structural layer having a movable contact positioned for contacting the stationary contact when the structural layer moves toward the substrate;

(c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and (d) wherein the electrothermal latch is attached to a top side of the structural layer for producing heat on the top side of the dielectric layer to deflect the structural layer towards the substrate.

10. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the electrothermal latch extends substantially the length of the structural layer.

11. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the electrothermal latch includes at least one conductive path extending substantially the length of the structural layer.

12. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the electrothermal latch includes two conductive paths extending substantially the length of the structural layer and along the outside of the top surface of the structural layer.

13. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the electrothermal latch includes at least one resistance path transition effecting an abrupt change in electrical resistance for generating heat at the location of the resistance path transition.

14. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) wherein the electrothermal latch includes at least one resistance path transition positioned adjacent the at least one fixed end for effecting an abrupt change in electrical resistance for generating heat adjacent the at least one fixed end.

15. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) further including a contact interconnect attached on an opposite side of the dielectric layer from the movable contact and having electrical communication with the movable contact.

16. A self-latching microscale switch having a movable microcomponent, the switch comprising:
   (a) a substrate including a stationary contact;
   (b) a structural layer having a movable contact positioned for contacting the stationary contact when the structural layer moves toward the substrate;
   (c) an electrothermal latch attached to the structural layer and having electrical communication with the movable contact to provide current flow between the electrothermal latch and the stationary contact when the movable contact contacts the stationary contact for maintaining the movable contact in contact with the stationary contact; and
   (d) further including a contact interconnect attached on an opposite side of the dielectric layer from the movable contact and having electrical communication with the movable contact; and
   (e) wherein the electrothermal latch is in electrical communication with the contact interconnect.

17. A method for maintaining a microscale switch in a closed position, the method comprising:
   (a) providing a stationary contact formed on a substrate;
   (b) providing a movable microcomponent suspended above the substrate, the microcomponent comprising:
      (i) a structural layer having a movable contact positioned for contacting the stationary contact when the structural layer is moved towards the substrate; and
      (ii) an electrothermal latch attached to the structural layer and having electrical communication with the movable contact;

(c) moving the structural layer towards the substrate whereby the movable contact moves into contact with the stationary contact;

(d) providing current flow between the electrothermal latch and the stationary contact to maintain the movable contact in contact with the stationary contact; and (e) wherein the electrothermal latch is attached to a top side of the structural layer and produces heat on the top side of the dielectric layer to deflect the structural layer towards the substrate.

18. A method for maintaining a microscale switch in a closed position, the method comprising:

(a) providing a stationary contact formed on a substrate;

(b) providing a movable microcomponent suspended above the substrate, the microcomponent comprising:
 (i) a structural layer having a movable contact positioned for contacting the stationary contact when the structural layer is moved towards the substrate; and
 (ii) an electrothermal latch attached to the structural layer and having electrical communication with the movable contact;

(c) moving the structural layer towards the substrate whereby the movable contact moves into contact with the stationary contact;

(d) providing current flow between the electrothermal latch and the stationary contact to maintain the movable contact in contact with the stationary contact; and (e) wherein the electrothermal latch includes at least one resistance path transition effecting an abrupt change in electrical resistance for generating heat at the location of the resistance path transition.

19. A method for maintaining a microscale switch in a closed position, the method comprising:

(a) providing a stationary contact formed on a substrate;

(b) providing a movable microcomponent suspended above the substrate, the microcomponent comprising:
 (i) a structural layer having a movable contact positioned for contacting the stationary contact when the structural layer is moved towards the substrate; and
 (ii) an electrothermal latch attached to the structural layer and having electrical communication with the movable contact;

(c) moving the structural layer towards the substrate whereby the movable contact moves into contact with the stationary contact;

(d) providing current flow between the electrothermal latch and the stationary contact to maintain the movable contact in contact with the stationary contact; and (e) further including providing a stationary electrode formed on the substrate and a movable electrode attached to the structural layer, and wherein moving the structural layer includes applying a voltage difference between the movable electrode and the stationary electrode to move the structural layer towards the substrate.

20. A self-latching microscale switch having a movable microcomponent, the switch comprising:

(a) a substrate including a stationary contact and a stationary electrode;

(b) a multi-layer beam extending at least partially over the substrate and comprising a structural layer and a moveable contact, the moveable contact adapted for movement between an open and a closed position, wherein the beam comprises at least two electrically connected layers and the beam adapted for electrostatic actuation to cause the movable contact to move from the open position, wherein the moveable contact is out of contact with the stationary contact, to the closed position, and wherein the movable contact is in contact with the stationary contact; and (c) a dielectric structural layer positioned at least partially between the two electrically connected layers.

* * * * *